United States Patent [19]

Yoo et al.

[11] Patent Number: 5,715,210

[45] Date of Patent: Feb. 3, 1998

[54] LOW POWER SEMICONDUCTOR MEMORY DEVICE

[75] Inventors: Jei-Hwan Yoo; Bok-Moon Kang, both of Suwon, Rep. of Korea

[73] Assignee: Samsung Electronics Co., Ltd., Suwon, Rep. of Korea

[21] Appl. No.: 719,226

[22] Filed: Sep. 25, 1996

[30] Foreign Application Priority Data

Sep. 29, 1995 [KR] Rep. of Korea .................. 33097/1995

[51] Int. Cl.$^6$ .................................................. G11C 7/00
[52] U.S. Cl. .................. 365/230.06; 365/198; 365/207; 365/227; 365/189.01; 365/190
[58] Field of Search ................... 365/230.06, 189.05, 365/189.01, 198, 190, 230.03, 227, 207, 149

[56] References Cited

U.S. PATENT DOCUMENTS

| | | | |
|---|---|---|---|
| 5,119,334 | 6/1992 | Fujii | 365/230.06 |
| 5,392,242 | 2/1995 | Koike | 365/230.03 |
| 5,473,576 | 12/1995 | Matsui | 365/190 |
| 5,519,661 | 5/1996 | Miura | 365/190 |

*Primary Examiner*—Tan T. Nguyen
*Attorney, Agent, or Firm*—Marger, Johnson, McCollom & Stolowitz, PC

[57] ABSTRACT

A low power semiconductor memory device for minimizing power consumption is disclosed. The low power semiconductor memory device includes a memory cell array with a plurality of memory cells connected to a pair of bit lines, and having first and second pairs of data lines each having a normal data line and a complementary data line. The device further includes a first switching circuit for switch-connecting the pair of bit lines to the first pair of data lines in response to column select information and a sense amplifier connected to the pair of bit lines within the memory cell array. A driving circuit transfers external data to one of the normal data line and the complementary data line of the second pair of data lines in response to a write master signal. A data transfer circuit respectively transfers a signal of the normal data line of the second pair of data lines and an inverted signal thereof to the normal data line and the complementary data line of the first pair of data lines in response to the input of the write master signal.

20 Claims, 4 Drawing Sheets

LOW POWER SEMICONDUCTOR MEMORY DEVICE

BACKGROUND OF THE INVENTION

1. Field of the Invention

The present invention relates to a low power semiconductor memory device, and more particularly to a semiconductor memory device for minimizing power consumption by reducing the number of data lines with level transition during data access.

The present application for a low power semiconductor memory device is based on Korean Application No. 33097/1995 which is incorporated herein by reference for all purposes.

2. Description of the Related Art

The operating frequency requirements of a semiconductor memory device, for example, of a dynamic random access memory are ever increasing. Operating a semiconductor memory device at a high frequency demand an increase in operating current. Meanwhile, the size of a chip becomes larger due to a tendency toward a high density of the memory, also increasing power consumption and dissipation needs. In the semiconductor memory device with such an increased integration, the number of data lines for accessing data of a highly integrated memory cell increases, and the data input/output lines become longer. It is apparent to those skilled in the art that in the semiconductor memory device above 256 Mbit-class, for example, the length of the data line is lengthened to a unit of centimeters and the number of the data lines increases.

In order to reduce power consumption according to the increased length of the data line and to the increased number of the data lines, circuits for reducing the swing width of data during read and write operations of the data have been proposed. For instance, when reading the data of the memory cell, a current sense amplifier is used to reduce the swing width of the data transferred to the data line, thereby greatly reducing current consumption. However, the conventional technique for using the current sense amplifier is ineffective to reduce the swing width of the data transferred to the data line during the data write operation. In order to reduce the swing width of the data transferred to the data line when writing the data, the current sense amplifier should be arranged around a memory cell array, that is, around a memory core. However, since the area of such a layout greatly increases, it is of no practical use. Further, since timing during the write operation is restricted to a short cycle, it is very difficult to reduce the swing width of the data. The above disadvantages will be more apparent by the following description.

FIG. 1 illustrates a conventional semiconductor memory device. A sense amplifier 14 is connected between a normal bit line BL and a complementary bit line BLB of a pair of bit lines BL/BLB within a memory cell array 12. A first pair of data lines LIO/LIOB, a second pair of data lines GIO/GIOB, and a third pair of data lines DIO/DIOB are connected between the pair of bit lines BL/BLB and data input and output pads DIN and DO.

The operation of a data write path of the conventional semiconductor memory device will now be described with reference to FIG. 1.

If data information having prescribed logic is supplied to the data input pad DIN, the data information is buffered by a data input buffer 16 and supplied to the common input node of a data input/output driver 18a and an inverter 20. The output node of the inverter 20 is connected to the input node of another data input/output driver 18b. If a write master signal φWR is activated to logic "HIGH", the data input/output drivers 18a and 18b transfer the data information with the opposite phase to each other to the normal data line DIO and the complementary data line DIOB of the third pair of data lines DIO/DIOB, respectively. If the data information generated from the data input buffer 16 is logic "HIGH", the data information of logic "HIGH" is transferred to the normal data line DIO of the third pair of data lines DIO/DIOB, and the data information of logic "LOW" is transferred to the complementary data line DIOB of the third pair of data lines DIO/DIOB. The configuration of the data input/output driver is shown in FIG. 2, and the operation thereof will be apparently understood by the description of FIG. 2.

The data information transferred to the third pair of data lines DIO/DIOB is transferred to the second pair of data lines GIO/GIOB by global input/output drivers 22a and 22b having respective input nodes respectively connected to the normal data line DIO and the complementary data line DIOB of the third pair of data lines DIO/DIOB and having respective output nodes respectively connected to a normal data line GIO and a complementary data line GIOB of the second pair of data lines GIO/GIOB. The global input/output drivers 22a and 22b drive a signal of the input node to the output node in response to the activation of the write master signal φWR. Global switches 26a and 26b connected in parallel to the global input/output drivers 22a and 22b are disabled by a control signal GIOSWE which is inactivated to logic "LOW" during a write mode. That is, internal transmission gates are all turned off. The operation of the global switches 26a and 26b is described later on. The global switches 26a and 26b are used as data read paths.

The data information transferred to the normal data line GIO and the complementary data line GIOB of the second pair of data lines GIO/GIOB is supplied to transmission gates 34 and 36 within a local switch 24. The transmission gates 34 and 36 are connected between respective lines of the second pair of data lines GIO/GIOB and the first pair of data lines LIO/LIOB and switched by the logic of a local switching control signal LIOSWE. If the local switching control signal LIOSWE is logic "HIGH", the transmission gates 34 and 36 are turned on and thus each line of the second pair of data lines GIO/GIOB is connected to each line of the first pair of data lines LIO/LIOB. A normal data line LIO and a complementary data line LIOB of the first pair of data lines LIO/LIOB are connected to each line of the pair of bit lines BL/BLB through the channels of column select gates 100 and 102, each consisting of an NMOS transistor, respectively. The column select gates 100 and 102 are turned on when a column select line CSL is activated to logic "HIGH" by a column decoder for decoding column address information, for example, a column address signal, to transfer the data information of the first pair of data lines LIO/LIOB to the pair of bit lines BL/BLB.

That is, the data information of the opposite phase transferred to each line of the third pair of data lines DIO/DIOB is supplied to the bit line sense amplifier 14 through the second pair of data lines GIO/GIOB, the first pair of data lines LIO/LIOB and the pair of bit lines BL/BLB. The bit line sense amplifier 14 amplifies the data information of the pair of bit lines BL/BLB and stores the amplified data information in a corresponding cell within the memory cell array 12. In the above write processes, the third, second and first pairs of data lines respectively consist of the normal data line and the complementary data lines. A pair of data lines thus has the opposite phase to each other of the data information received through the data input buffer 16 and transfers the data information to the pair of bit lines BL/BLB to be stored in the memory cell.

When reading the data stored in the memory cell within the memory cell array 12, the normal bit line BL and the complementary bit line BLB of the pair of bit lines BL/BLB have the opposite phase to each other by the operation of the bit line sense amplifier 14, as is well known. For instance, the data information of logic "1" is read, the normal bit line BL is set to a "HIGH" level, and the complementary bit line BLB is set to a "LOW" level. The data information on the pair of bit lines BL/BLB is transferred to the first pair of data lines LIO/LIOB through the channels of the column select gates 100 and 102. The data information on the first pair of data lines LIO/LIOB is transferred to the second pair of data lines GIO/GIOB through the transmission gates 34 and 36 within the local switch circuit 24. In this instance, the global input/output drivers 22a and 22b are disabled by the write master signal φWR of logic "LOW", and the global switches 26a and 26b connected in parallel to the global input/output driver 22a and 22b are enabled, thereby transferring the read data information transferred to the second pair of data lines GIO/GIOB to the third pair of data lines DIO/DIOB.

The read data information transferred to the third pair of data lines DIO/DIOB is amplified by a current input/output sense amplifier 30 connected across the normal data line DIO and the complementary data line DIOB of the third pair of data lines DIO/DIOB, and the data of logic "1" or "0" is supplied to a data output buffer 32. The current input/output sense amplifier 30 is shown in detail in FIG. 3, and its operation will be described later on. The data output buffer 32 transfers the data generated from the current input/output sense amplifier 32 to the output pad DO.

In the semiconductor memory device shown in FIG. 1, when writing the data information applied from the exterior in the memory cell, the data information applied from the exterior is transferred to the pair of bit lines by using the third, second and first pairs of data lines phase-changed with the opposite phase on the normal data line and the complementary data line. Therefore, the power consumption increases during the write operation. In a highly integrated semiconductor memory device, the length of each pair of data lines becomes longer, and the level transition of each pair of data lines occurs each time the data information is transferred, thereby inevitably causing increased current consumption. That is, in the highly integrated semiconductor memory device, the more stages of each pair of data lines, the more current consumption is increased by the level transitions.

FIG. 2 illustrates the logic circuitry of the data input/output driver and the global input/output driver shown in FIG. 1. The data information having a logic "LOW" or "HIGH" level is supplied to each one input node of a NAND gate 42 and a NOR gate 44. The write signal φWR which is activated to logic "HIGH" during a write mode is applied to another input node of the NAND gate 42. The write signal φWR is inverted by an inverter 40 and the inverse write signal is supplied to another input node of the NOR gate 44. When the write signal φWR is activated to logic "HIGH", if the data information of logic "HIGH" is applied, only a PMOS transistor 46 connected to the output node of the NAND gate 42 is turned on, and an NMOS transistor 48 connected to the output node of the NOR gate 44 is turned off, thereby driving an output terminal OUT to logic "HIGH". When the write signal φWR is activated to logic "HIGH", if the data information of logic "LOW" is applied, the NMOS transistor 48 connected to the output node of the NOR gate 44 is turned on, and the PMOS transistor 46 connected to the output node of the NAND gate 42 is turned off, thereby pulling down the output terminal OUT to logic "LOW". In FIG. 2, each data input node IN of the NAND gate 42 and the NOR gate 44 is one of the third pair of data lines DIO/DIOB or the second pair of data lines GIO/GIOB of FIG. 1, and the output terminal OUT is connected to one of second pair of data lines GIO/GIOB or the first pair of data lines LIO/LIOB.

Referring to FIG. 3, there is illustrated the configuration of the current input/output sense amplifier 30 of FIG. 1 connected to the normal data line DIO and the complementary data line DIOB of the third pair of data lines DIO/DIOB. If a sensing enable signal φIOSI is activated to logic "HIGH", NMOS transistors 54, 56 and 58 are turned on, and a PMOS transistor 60 is turned off. If the NMOS transistors 54, 56 and 58 are turned on, the current of nodes N1 and N2 flows toward a ground through the channels of the sources-to-drains of the NMOS transistors 54 and 56 and through the channel of the source-to-drain of the NMOS transistor 58. In this case, PMOS transistors 50 and 52 with the gates cross-connected to the nodes N2 and N1 are turned on, the current supplied through the third pair of data lines DIO/DIOB flows toward the ground through the channels of the sources-to-drains of the PMOS transistors 50 and 52, through the channels of the drains-to-sources of the NMOS transistors 54 and 56 and through the channel of the drain-to-source of the NMOS transistor 58. If the potential level of the normal data line DIO of the third pair of data lines DIO/DIOB is set to logic "HIGH", and if the potential level of the complementary data line DIOB is set to logic "LOW", the PMOS transistors 50 and 52 are turned on and turned off respectively. Hence, the amount of the current flowing into the node N1 increases, and the amount of the current flowing into the node N2 relatively decreases. That is, the voltage level of the node N1 is set to logic "HIGH", and that of the node N2 is set to logic "LOW". A comparator 62 with two inputs connected to the nodes N1 and N2 compares input voltage levels and transfers data corresponding to the data information of the third pair of data lines DIO/DIOB to the data output buffer 32.

However, the conventional semiconductor memory device having the data input/output drivers and the input/output sense amplifier shown in FIGS. 2 and 3 changes the voltage level of the normal data line and the complementary data line of all the pairs of data lines within the chip during the data write operation. Therefore, the current consumption increases and such a semiconductor memory device is very disadvantageous to high integration.

SUMMARY OF THE INVENTION

It is an object of the present invention to minimize power consumption in a semiconductor memory device by greatly reducing the number of data lines with level transition during data access.

It is another object of the present invention to differently transfer data information of a data line when reading and writing data from and in a memory cell of a semiconductor memory device.

It is still another object of the present invention to reduce the number of data lines changed during a data write operation in a semiconductor memory device and thus greatly reduce current consumption according to the level transition of data lines. In accordance with the invention, this is accomplished by transferring data to be written only to one line of a pair of data lines when writing the data in a memory cell.

It is still yet another object of the present invention to provide a narrow swing width by using both a normal data line and a complementary data line of a pair of data lines when reading data stored in a memory cell in a semiconductor memory device and minimize power consumption according to level transition. This object is also enabled in the present invention by using only one line of a pair of data lines when writing the data.

According to one aspect of the present invention, a low power semiconductor memory device having a memory cell array with a plurality of memory cells connected to a pair of bit lines, and having first and second pairs of data lines each having a normal data line and a complementary data line, includes a first switching circuit for switch-connecting the pair of bit lines to the first pair of data lines in response to column select information, a sense amplifier connected to the pair of bit lines within the memory cell array, a driving circuit for transferring external data to either the normal data line or the complementary data line of the second pair of data lines in response to a write master signal, and a data transfer circuit for respectively transferring a signal of the normal data line of the second pair of data lines and an inverted signal thereof to the normal data line and the complementary data line of the first pair of data lines in response to the input of the write master signal.

In addition to the above objects and features, the invention provides a semiconductor memory device configuration for minimizing a layout of a chip by simplifying peripheral circuits used for data input/output path control.

Other objects, features and advantages of the present invention will become more readily apparent from the following detailed description of a preferred embodiment which proceeds with reference to the following drawings.

DETAILED DESCRIPTION OF THE PREFERRED EMBODIMENT

Figure 1:
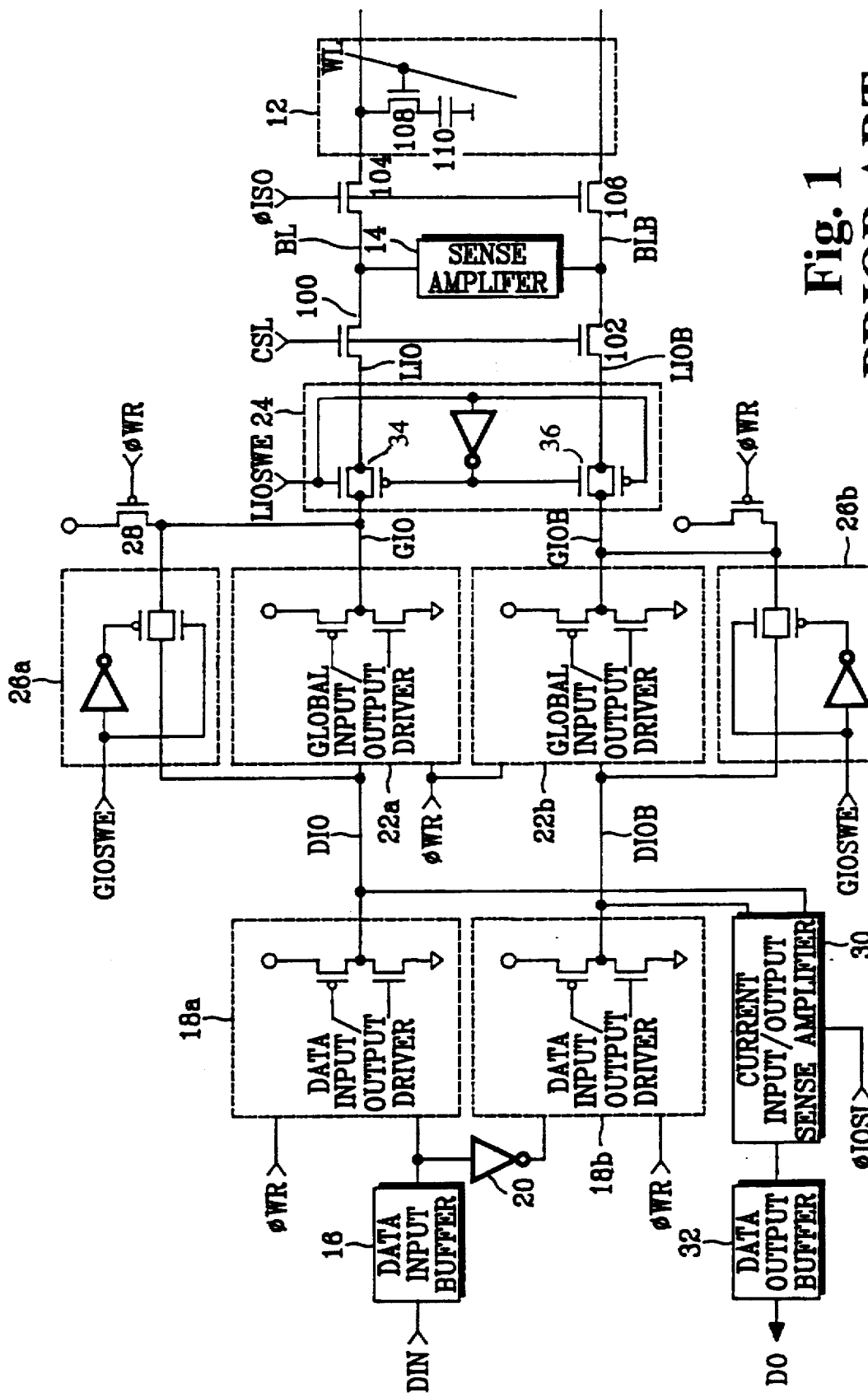
FIG. 1 is a circuit diagram of a conventional semiconductor memory device.
Figure 2:
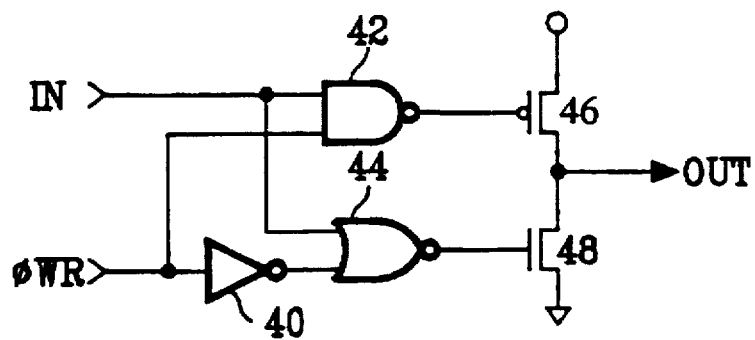
FIG. 2 is a more detailed circuit diagram of a data input/output driver and a global input/output driver shown in FIG. 1.
Figure 3:
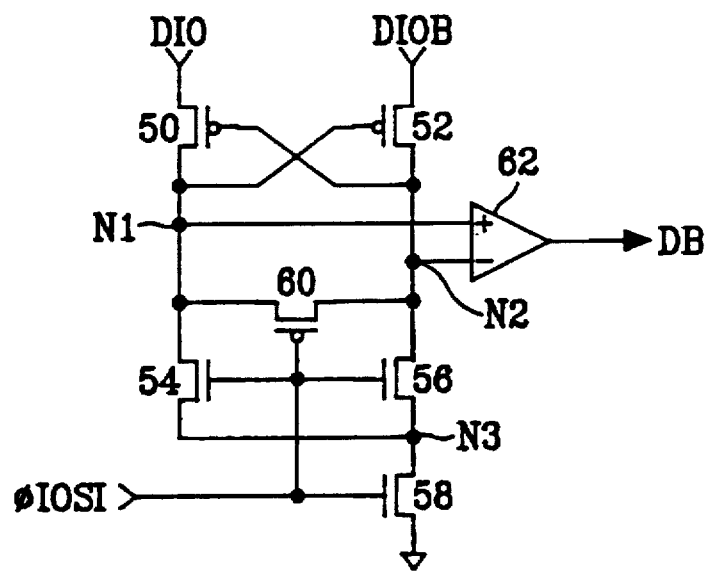
FIG. 3 is a more detailed circuit diagram of a current input/output sense amplifier shown in FIG. 1.
Figure 4:
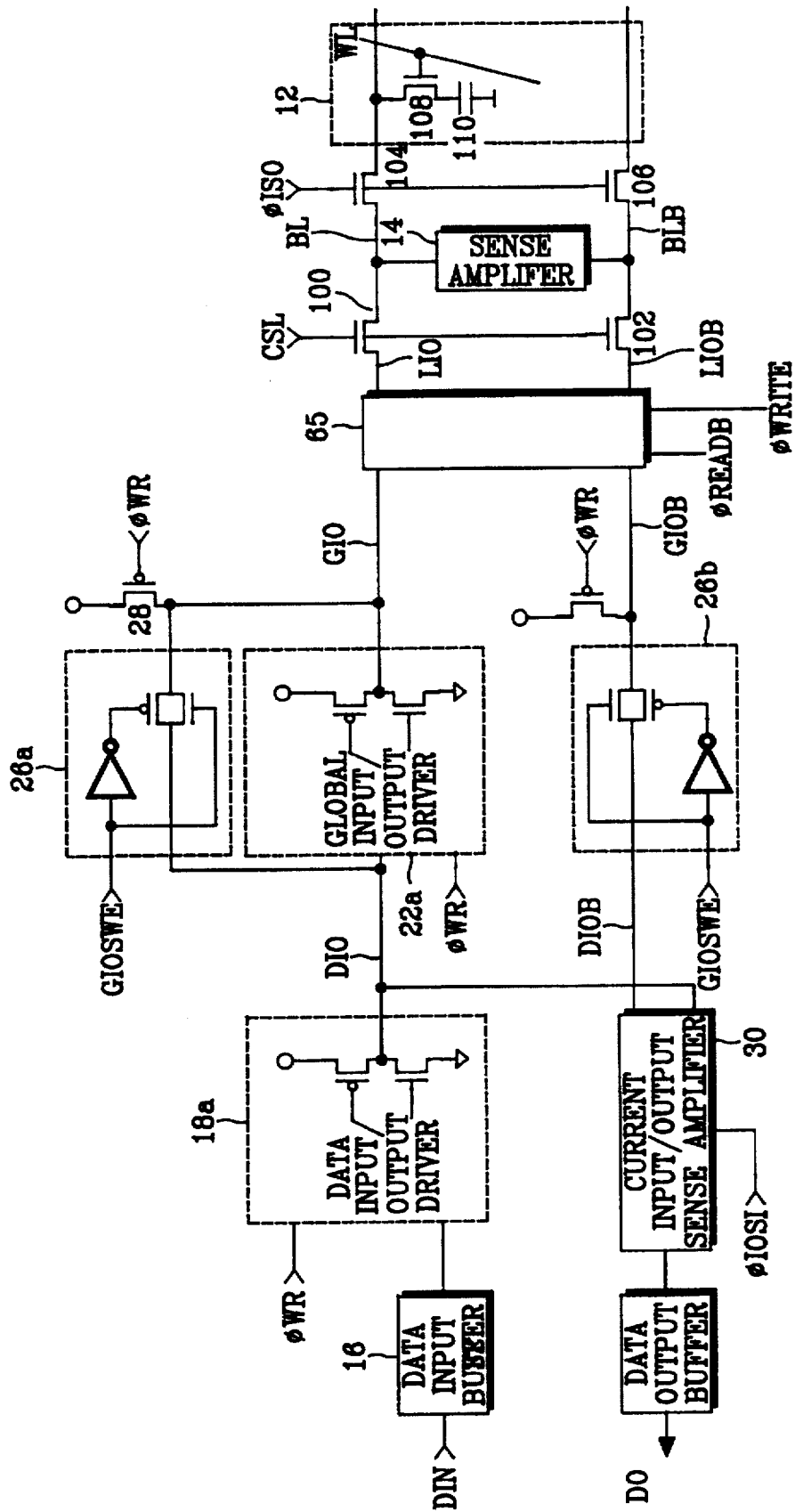
FIG. 4 is a circuit diagram of a semiconductor memory device according to the present invention, and illustrates a data input/output path for achieving a low power operation by reducing the swing width of a signal of input/output lines.

FIG. 4 shows the configuration of a semiconductor memory device according to the present invention and illustrates a data input/output path for achieving a low power operation by reducing the swing width of a signal on the input/output lines. Those elements of FIG. 4 having the substantially same construction and function as elements of FIG. 1 are designated by like reference numerals and symbols.

WRITE MODE

When data DIN is supplied to a data input buffer 16, the data input buffer 16 supplies the input data DIN to a single data input/output driver 18a. The data input/output driver 18a drives the data DIN only to a normal data line DIO out of a third pair of data lines DIO/DIOB in response to a write signal φWR of logic "HIGH". For example, if the input data DIN is logic "HIGH", a signal of logic "HIGH" is transferred only to the normal data line DIO of the third pair of data lines DIO/DIOB. A single global input/output driver 22a transfers data information received in response to the write signal φWR of logic "HIGH" to a normal data line GIO of a second pair of data lines GIO/GIOB. A first global switch 26a connected in parallel to the global input/output driver 22a, and a second global switch 26b connected between a complementary data line DIOB of the third pair of data lines DIO/DIOB and a complementary data line GIO of the second pair of data lines GIO/GIOB are maintained at a disabled state by a control signal GIOSWE of logic "LOW". Meanwhile, PMOS transistors 28 with respective sources connected to a precharge voltage are turned on when the write signal φWR is in an inactive state of logic "LOW", thereby precharging the potentials of the normal data line GIO and the complementary data line GIOB of the second pair of data lines GIO/GIOB to a prescribed level. Therefore, when the data DIN is applied from the exterior, the data information is transferred only to the normal data lines DIO and GIO out of the third pair of data lines DIO/DIOB and the second pair of data lines GIO/GIOB.

Figure 5:
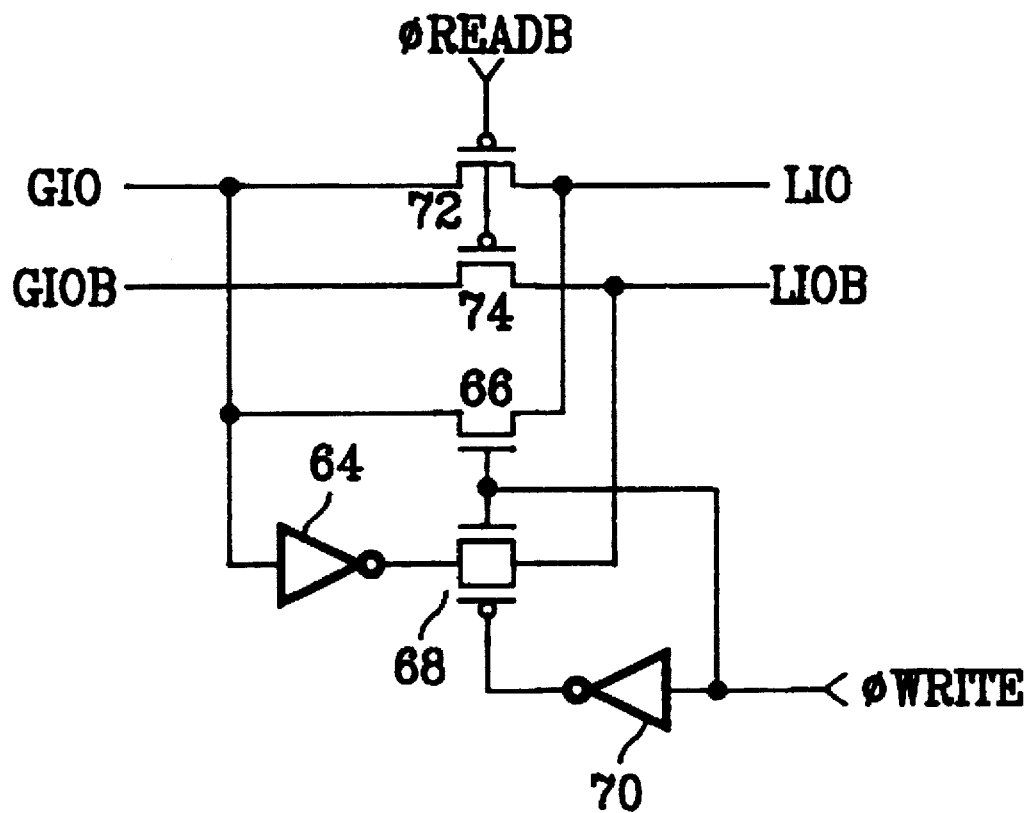
FIG. 5 is a more detailed circuit diagram of a local switch shown in FIG. 4.

A local switch 65, described in further detail with reference to FIG. 5, is connected across the complementary data line pairs GIO/GIOB and LIO/LIOB. If a read path control signal (φREADB of logic "HIGH" and a write path control signal φWRITE of logic "HIGH" are applied to a local switch 65, the local switch 65 connects the data information of logic "HIGH" of the normal data line GIO of the second pair of data lines GIO/GIOB to a normal data line LIO of a first pair of data lines LIO/LIOB and simultaneously supplies the inverted data information of logic "LOW" to a complementary data line LIOB of the first pair of data lines LIO/LIOB. That is, the local switch 65 connects the normal data line of the input direction of the write data to the normal data line of the output direction, and simultaneously connects the data information with the opposite phase to the data transferred to the normal data line of the input direction to the complementary data line of the output direction. Therefore, the data information of logic "HIGH" is transferred to the normal data line LIO of the first pair of data lines LIO/LIOB, and the data information of logic "LOW" is transferred to the complementary data line LIOB of the first pair of data lines LIO/LIOB.

When the data information having the opposite phase to each other is transferred to each data line of the first pair of data lines LIO/LIOB, if a column select line CSL is activated to logic "HIGH" by the input of column address information, the data information of the first pair of data lines LIO/LIOB is transferred to a pair of bit lines BL/BLB. The data information transferred to the pair of bit lines BL/BLB is stored in a corresponding memory cell within a memory cell array 12 by the operation of bit line sense amplifier 14 and other circuits.

The circuit having a data path shown in FIG. 4 transfers the write data from the data input buffer 16 to a pair of data transfer lines connected to the input nodes of column select gates 100 and 102 by using only one normal data line. Hence, the level transition number of the second and third pairs of data transfer lines is reduced to about half in comparison with a method of transferring data by using two data transmission lines of the pair of transfer lines. Consequently, the current consumption of the data lines is reduced to half relative to the circuit of FIG. 1.

READ MODE

When a data signal is accessed from a corresponding memory cell in response to the activation of a word line within the memory cell array 12, and the data signal is developed by the sense amplifier 14 and transferred to the pair of bit lines BL/BLB to activate the column select line CSL, the data information of the pair of bit lines BL/BLB is transferred to each data line of the first pair of data lines LIO/LIOB. If the read path control signal φREADB of logic "LOW" and the write path control signal φWRITE of logic "LOW" are supplied, the local switch 65 connects the normal data line LIO and the complementary data line LIOB of the first pair of data lines LIO/LIOB to the normal data line GIO and the complementary data line GIOB of the second pair of data lines GIO/GIOB, respectively. Therefore, the data information of the normal data line GIO has the opposite phase to that of the complementary data line GIOB. The operation of the local switch is described in detail below.

During a read mode, the control signal GIOSWE of logic "HIGH" is supplied to the global switches 26a and 26b. Hence, the data information transferred to each data line of the second pair of data lines GIO/GIOB is transferred to the third pair of data lines DIO/DIOB through transmission gates within the global switches 26a and 26b. By the above-described operation, when the data information accessed from the memory cell is transferred to the third pair of data lines DIO/DIOB through each normal data line and each complementary data line of the first pair of data lines LIO/LIOB and the second pair of data lines GIO/GIOB, the transferred data information is sensed and amplified by a current input/output sense amplifier 30 and transferred to an output pad as data of "1" or "0".

FIG. 5 is a more detailed circuit diagram of the local switch 65 shown in FIG. 4.

Referring to FIG. 5, the local switch 65 includes two PMOS pass transistors 72 and 74 for connecting each data line of the second pair of data lines GIO/GIOB to each data line of the first pair of data lines LIO/LIOB in response to the activation of the read path control signal φREADB, and an inverter 64 for inverting data information of the normal data line GIO of the second pair of data lines GIO/GIOB. An NMOS pass transistor 66 and a transfer circuit are respectively connected between the normal data line GIO of the second pair of data lines GIO/GIOB and the normal data line LIO of the first pair of data lines LIO/LIOB and between the output node of the inverter 64 and the complementary data line LIOB of the first pair of data lines LIO/LIOB, and form the channels in response to the activation of the write path control signal φWRITE. The transfer circuit includes a transmission gate 68 comprising a pair of NMOS and PMOS pass transistors, and an inverter 70 for driving the PMOS transistor. When the write path control signal φWRITE of logic "HIGH" is supplied, if data is transferred to the normal data line GIO of the second pair of data lines GIO/GIOB, the data is transferred to the normal data line LIO of the first pair of data lines LIO/LIOB by the NMOS transistor 66, and simultaneously phase-inverted data information is transferred to the complementary data line LIOB of the first pair of data lines LIO/LIOB by the inverter 64 and the transmission gate 68.

If the read path control signal φREADB of logic "LOW" and the write path control signal φWRITE of logic "LOW" are supplied, the transmission gate 68 is turned off, and the PMOS transistors 72 and 74 are turned on. If the read path control signal φREADB is activated to logic "HIGH", the local switch 65 connects each data line of the first pair of data lines LIO/LIOB and each data line of the second pair of data lines GIO/GIOB. Therefore, if the column select gates 100 and 102 (FIG. 4) are turned on to transfer each data signal of the normal bit line BL and the complementary bit line BLB of the pair of bit lines BL/BLB to the first pair of data lines LIO/LIOB, the data signal of each data line of the first pair of data lines LIO/LIOB is transferred to the normal data line GIO and the complementary data line GIOB of the second pair of data lines GIO/GIOB by a read path of the local switch 65.

Consequently, since the semiconductor memory device of FIG. 4 having the local switch 65 of FIG. 5 transfers the data by using only a single path of a plural pair of data lines during the data write operation, the current consumption can be greatly reduced. That is, the write data is transferred to the pair of bit lines by using only the normal data lines without using the complementary data lines of a plural pair of data lines during the data write operation. Hence, the current consumed during data transfer can be remarkably reduced.

As noted above, the data transfer path of a single path is used. Therefore, as the integrated degree of the semiconductor memory device becomes denser, the consumed current can be efficiently reduced. Also, by substituting local switch 65 for local switch 24 in the manner described above, the circuit of FIG. 1 can be simplified by elimination of drivers 18b and 22b.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A low power semiconductor memory device including a memory cell array having a plurality of memory cells connected to a pair of bit lines, and including first and second pairs of data lines each having a normal data line and a complementary data line, said low power semiconductor memory device comprising:

a first switching unit for switch-connecting said pair of bit lines to said first pair of data lines in response to column select information;

a sense amplifier connected to said pair of bit lines within said memory cell array;

a driving unit for transferring external data to one of the normal data line and the complementary data line of said second pair of data lines in response to a write master signal; and a data transfer unit for respectively transferring information of the normal data line of said second pair of data lines and inverted information thereof to the normal data line and the complementary data line of said first pair of data lines in response to the input of said write master signal.

2. The low power semiconductor memory device as claimed in claim 1, wherein said data transfer unit comprises:

a first connecting unit for connecting the normal data line of said second pair of data lines to the normal data line of said first pair of data lines, said first connecting unit being switched by the input of said write master signal; and a second connecting unit for inverting information of the normal data line of said second pair of data lines, and supplying said inverted information to the complementary data line of said first pair of data lines, said second connecting unit being switched by the input of said write master signal.

3. The low power semiconductor memory device as claimed in claim 2, wherein said second connecting unit comprises:
an inverting unit for inverting a signal of the normal data line of said second pair of data lines; and
a transmission gate having a channel formed between an output node of said inverting unit and the complementary data line of said first pair of data lines, said transmission gate being switched by said write master signal.

4. The low power semiconductor memory device as claimed in claim 2, wherein said first connecting unit comprises:
an NMOS transistor having a channel connected between the normal data line of said second pair of data lines and the normal data line of said first pair of data lines, and having a gate connected to said write master signal.

5. A low power semiconductor memory device including a memory cell array having a plurality of memory cells connected to a pair of bit lines, and including first and second pairs of data lines each having a normal data line and a complementary data line, said low power semiconductor memory device comprising:
a first switching unit for switch-connecting said pair of bit lines to said first pair of data lines in response to column select information;
a sense amplifier connected to said pair of bit lines within said memory cell array;
a driving unit for transferring external data to one of the normal data line and the complementary data line of said second pair of data lines in response to a write master signal;
a data transfer unit for respectively transferring information of the normal data line of said second pair of data lines and inverted information thereof to the normal data line and the complementary data line of said first pair of data lines in response to the input of said write master signal, and transferring a signal of said first pair of data lines to said second pair of data lines in response to the input of a read master signal; and
an input/output sense amplifier for amplifying a voltage difference between the normal data line and the complementary data line of said second pair of data lines and generating data corresponding thereto in a read mode, said input/output sense amplifier being operatively connected to said second pair of data lines.

6. The low power semiconductor memory device as claimed in claim 5, wherein said data transfer unit comprises:
a first connecting unit for connecting the normal data line of said second pair of data lines to that of said first pair of data lines, said first connecting unit being switched by the input of said write master signal;
a second connecting unit for inverting a signal of the normal data line of said second pair of data lines, and supplying the inverted signal to the complementary data line of said first pair of data lines, said second connecting unit being switched by the input of said write master signal; and
a third connecting unit for connecting said first pair of data lines to said second pair of data lines in response to said read master signal.

7. The low power semiconductor memory device as claimed in claim 6, wherein said second connecting unit comprises:
an inverting unit for inverting a signal of the normal data line of said second pair of data lines; and
a transmission gate having a channel formed between an output node of said inverting unit and the complementary data line of said first pair of data lines, said transmission gate being switched by said write master signal.

8. The low power semiconductor memory device as claimed in claim 6, wherein said first connecting unit comprises:
an NMOS transistor having a channel connected between the normal data line of said second pair of data lines and the normal data line of said first pair of data lines, and having a gate connected to said write master signal.

9. The low power semiconductor memory device as claimed in claim 6, wherein said third connecting unit comprises:
MOS transistors connected between respective normal data lines and between respective complementary data lines of said first and second pairs of data lines, said MOS transistors being switched by the input of said read master signal.

10. The low power semiconductor memory device as claimed in claim 9, wherein each of said MOS transistors is a PMOS pass transistor.

11. A low power semiconductor memory device including a memory cell array having a plurality of memory cells connected to a pair of bit lines, and including first, second and third pairs of data lines each having a normal data line and a complementary data line, said low power semiconductor memory device comprising:
a first switching unit for switch-connecting said pair of bit lines to said first pair of data lines in response to column select information;
a sense amplifier connected to said pair of bit lines within said memory cell array;
a first driving unit for transferring external data to one of the normal data line and the complementary data line of said third pair of data lines in response to a write master signal;
a second driving unit for transferring information of said one of the normal data line and the complementary data line of said third pair of data lines to one of the normal data line and the complementary data line of said second pair of data lines in response to said write master signal; and
a data transfer unit for transferring information of said one of the normal data line or the complementary data line of said second pair of data lines to the normal data line of said first pair of data lines, and simultaneously inverting information of the normal data line or the complementary data line of said second pair of data lines and transferring the inverted signal to one of the complementary data line and the normal data line of said first pair of data lines, in response to the input of said write master signal.

12. The low power semiconductor memory device as claimed in claim 11, wherein said data transfer unit comprises:
a first connecting unit for connecting the normal data line of said second pair of data lines to the normal data line of said first pair of data lines, said first connecting unit being switched by the input of said write master signal; and a second connecting unit for inverting a signal of the normal data line of said second pair of data lines, and supplying the inverted signal to the complementary data line of said first pair of data lines, said second connecting unit being switched by the input of said write master signal.

13. The low power semiconductor memory device as claimed in claim 12, wherein said second connecting unit comprises:

an inverting unit for inverting a signal of the normal data line of said second pair of data lines; and a transmission gate having a channel formed between an output node of said inverting unit and the complementary data line of said first pair of data lines, said transmission gate being switched by said write master signal.

14. The low power semiconductor memory device as claimed in claim 13, wherein said first connecting unit comprises:

an NMOS transistor having a channel connected between the normal data line of said second pair of data lines and that of said first pair of data lines, and having a gate connected to said write master signal.

15. A low power semiconductor memory device including a memory cell array having a plurality of memory cells connected to a pair of bit lines, and including first, second and third pairs of data lines each having a normal data line and a complementary data line, said low power semiconductor memory device comprising:

a first switching unit for switch-connecting said pair of bit lines to said first pair of data lines in response to column select information;

a sense amplifier connected to said pair of bit lines within said memory cell array;

a first driving unit for transferring external data to one of the normal data line and the complementary data line of said third pair of data lines in response to a write master signal;

a second driving unit for transferring information of said one of the normal data line and the complementary data line of said third pair of data lines to one of the normal data line and the complementary data line of said second pair of data lines in response to said write master signal;

a data transfer unit for respectively transferring information of said one of the normal data line and the complementary data line of said second pair of data lines and inverted information thereof to the normal data line and the complementary data line of said first pair of data line in response to the input of said write master signal, and transferring a signal of said first pair of data lines to said second pair of data lines in response to the input of a read master signal;

an input/output sense amplifier for amplifying a voltage difference between the normal data line and the complementary data line of said second and third pairs of data lines and generating data corresponding thereto in a read mode, said input/output sense amplifier being located at said third pair of data lines.

16. The low power semiconductor memory device as claimed in claim 15, wherein said data transfer unit comprises:

a first connecting unit for connecting the normal data line of said second pair of data lines to the normal data line of said first pair of data lines, said first connecting unit being switched by the input of said write master signal;

a second connecting unit for inverting a signal of the normal data line of said second pair of data lines, and supplying the inverted signal to the complementary data line of said first pair of data lines, said second connecting unit being switched by the input of said write master signal; and a third connecting unit for connecting said first pair of data lines to said second pair of data lines in response to said read master signal.

17. The low power semiconductor memory device as claimed in claim 16, wherein said second connecting unit comprises:

an inverting unit for inverting a signal of the normal data line of said second pair of data lined; and transmission gate transmission gate having a channel formed between an output node of said inverting unit and the complementary data line of said first pair of data lines, said transmission gate being switched by said write master signal.

18. The low power semiconductor memory device as claimed in claim 16, wherein said first connecting unit comprises:

an NMOS transistor having a channel connected between the normal data line of said second pair of data lines and that of said first pair of data lines, and having a gate connected to said write master signal.

19. The low power semiconductor memory device as claimed in claim 16, wherein said third connecting unit comprises:

MOS transistors connected between respective normal data lines and between respective complementary data lines of said first and second pairs of data lines, said MOS transistors being switched by the input of said read master signal.

20. The low power semiconductor memory device as claimed in claim 19, wherein each of said MOS transistors is a PMOS transistor.

* * * * *

UNITED STATES PATENT AND TRADEMARK OFFICE
CERTIFICATE OF CORRECTION

PATENT NO.   : 5,715,210
DATED        : February 3, 1998
INVENTOR(S)  : Yoo et al.

It is certified that error appears in the above-identified patent and that said Letters Patent is hereby corrected as shown below:

Column 12,
Line 29, "data lined" should read -- data lines --.
Line 30, "and transmission gate transmission gate" should read -- and a transmission gate --.

Signed and Sealed this

Twenty-second Day of October, 2002

Attest:

JAMES E. ROGAN
Attesting Officer        Director of the United States Patent and Trademark Office